United States Patent

Hsieh et al.

[11] Patent Number: 5,593,601
[45] Date of Patent: Jan. 14, 1997

[54] ETCHING RECIPE FOR THE CRSI FILM

[75] Inventors: Hsien-Fen Hsieh; Ming-Teh Hsu, both of Hsinchu, Taiwan

[73] Assignee: Industrial Technology Research Institute, Hsinchu, Taiwan

[21] Appl. No.: 456,918

[22] Filed: Jun. 1, 1995

[51] Int. Cl.[6] .................... B44C 1/22; C23C 1/00
[52] U.S. Cl. .................. 216/41; 216/99; 216/100; 216/13; 252/79.2; 252/79.3
[58] Field of Search .................. 216/41, 99, 100, 216/108, 109, 13; 252/79.2, 79.3, 79.4

[56] References Cited

U.S. PATENT DOCUMENTS 5,256,247  10/1993  Watanabe et al. ............ 252/79.3 X
5,258,093  11/1993  Maniar ......................... 156/626.1

*Primary Examiner*—William Powell
*Attorney, Agent, or Firm*—Bacon & Thomas

[57] ABSTRACT

An etchant recipe suitable for the photo-etching process of the CrSi metalized film in the patterning of electronic circuitry. The etchant comprises 100 to 120 parts of 36.5 to 38% HCl, 1.0 to 2.0 parts of 48.8 to 49.2% HF, 0 to 10 parts of 30.0 to 32.0% $H_2O_2$ and 50 to 100 parts of 85 to 87% $H_3PO_4$. A 0.1 g/100 cc wetting agent is optionally added.

6 Claims, 1 Drawing Sheet

ETCHING RECIPE FOR THE CRSI FILM

FIELD OF THE INVENTION

The present invention relates to a novel chemical recipe of an etchant, especially to an etchant suited in the patterning of circuitry on the CrSi film under a wet photo-etching process.

BACKGROUND OF THE INVENTION

The CrSi film is an important resistant material in the field of integrated circuits, owing to its high sheet resistance and low temperature coefficient of resistance. The preparation of CrSi film is compatible with the manufacture process of the semiconductor industry. With the high gauge factors, the CrSi film resistor has become an extensively applied component in the thin film strain gauge sensors.

The preparation of electronic integrated circuitry involves etching as a necessary processing step. In the etching procedure, a variety of etchants may be used according to the purposes and conditions of the etching.

Two major recipes for the etching of a CrSi film are the etchant with the major agent of $HNO_3$ and that using $H_2SO_4$ as its major agent. In the $HNO_3$ group, the $HNO_3/HF/H_3PO_4$ etchant and the $HNO_3/HF/CH_3COOH/H_2O$ etchant are two good examples.

Owing to the presence of $HNO_3$ in the $HNO_3$ group etchants, the positive photoresist may lose its adhesion to the CrSi film during the heated etching procedure. As a result, formation of the outer edge of the pattern is subject to attack by the etchant. A worse scenario is that the photoresist may be separated from the CrSi film, causing distortion of the pattern.

Furthermore, owing to the strong oxidation characteristic of $HNO_3$, the CrSi film surface exposed to the etchant would be passivated. The etching would therefore be retarded or cease.

On the other hand, in the $H_2SO_4$ group, the $H_2SO_4/H_2O$ and the $H_2SO_4/HF/CH_3COOH/H_2O$ etchant are of extensive application in the industry. The $H_2SO_4$ content of the etchant is most likely to react with the photoresist, especially the positive photoresist. The photoresist will then be burned which can subsequently lead to poor pattern definition and leave a deleterious residue.

As to the other etchants applicable to the CrSi film, there is an etchant containing 3 to 6 parts of HF and 4 to 6 parts of $H_2O$. This etchant contains a high HF content which hinders the integrity of the underlying Si-based films, such as $SiO_2$.

The $AlCl_3/H_3PO_4/H_2O$ is also a well-known etchant for the CrSi film. This etchant is not appropriate for mass production because the CrSi film pre-treatment with Zn-Pulver prior to the etching will reduce the productivity of the etching. Furthermore, the molybdaenmasken must be applied while using this etchant. This will raise the cost of the preparation of the film.

OBJECTS OF THE INVENTION

An object of this invention is to provide a novel etchant recipe which is appropriate in the patterning of circuitry on the CrSi film.

Another object of this invention is to provide an etchant that is appropriate in the wet etching of the CrSi film but does not react with the photoresist nor does it reduce the adhesion of the photoresist to the CrSi film.

Another object of this invention is to provide an etchant recipe with a lower HF acid content.

Another object of this invention is to provide an etchant recipe that is capable of activating the CrSi film surface to cause the etching process to proceed with more easiness.

Another object of this invention is to provide a new method of photo-etching for the CrSi film.

SUMMARY OF THE INVENTION

According to this invention, an etchant recipe for the photo-etching process on a CrSi metalized film in the patterning of electronic circuitry is provided. The etchant is comprised of 100 to 120 parts of 36.5 to 38% HCl, 1.0 to 2.0 parts of 48.8 to 49.2% HF, 0 to 10 parts of 30.0 to 32.0% $H_2O_2$ and 50 to 100 parts of 85 to 87% $H_3PO_4$. An 0.1g/100 cc wetting agent is optionally added. The HF acid volume content of this invention is less than 1% which is lower than the conventional etchant. The recipe of this invention is thus capable of preventing unnecessary etching of the $SiO_2$ substrate and does not influence the adhesion of the photoresist to the CrSi film.

The above and other objects and advantages of this invention may be clearly understood from the detailed description by referring to the following drawing.

DETAILED DESCRIPTION OF THE INVENTION

Figure 1:
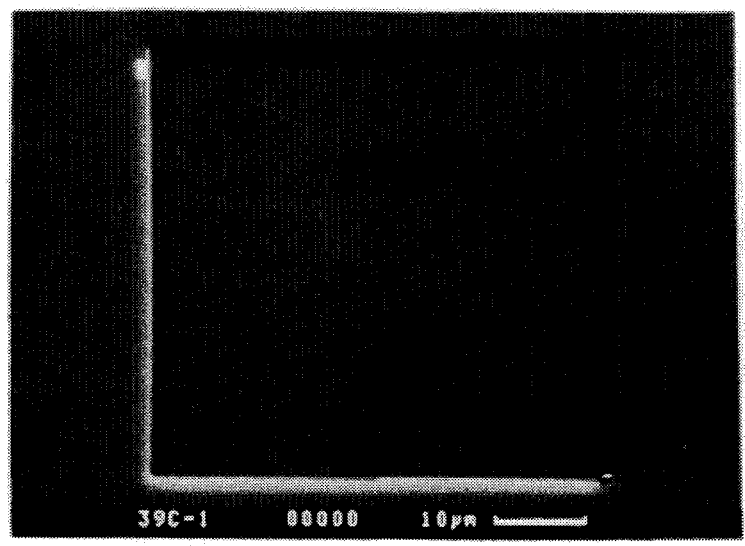
FIG. 1 is a photograph showing a CrSi film as etched with the etchant of this invention, under the observation of an electron microscope.

The etchant recipe of this invention is appropriate in the patterning of circuitry on the CrSi metalized film. The CrSi metalized film generally contains about 40 to 85% Cr and 15 to 60% Si and other optional trace components.

The etchant recipe for the CrSi film of this invention comprises: 100 to 120 parts of 36.5 to 38% HCl, 1.0 to 2.0 parts of 48.8 to 49.2% HF, 0 to 10 parts of 30.0 to 32.0% $H_2O_2$ and 50 to 100 parts of 85 to 87% $H_3PO_4$. A 0.1g/100 cc wetting agent may be optionally added. In the embodiment of this invention, the ratio of HCl to $H_2O_2$ should exceed a certain threshold so that the CrSi film may be activated to be suitable for the etching.

The optimum etching temperature may be decided according to the film properties. Also, the baking condition of the resist coating will influence the etching temperature. Generally, the temperature may be controlled between a range of 30° to 40° C.

EMBODIMENT

The following is a description of the embodiment of this invention.

A single Si wafer is oxidized under high temperature to form an $SiO_2$ insulation layer. A CrSi (60/40%) film is sputtered on the surface of the $SiO_2$ layer. Photo-etching process including lithography and etching is subsequently applied to the CrSi film.

Prepare an etchant comprising 100 parts of 37 to 38% HCl, 1.5 parts of 48.8 to 49.2% HF, 6 parts of 30.0 to 32.0% $H_2O_2$ and 70 parts of 85 to 87% $H_3PO_4$. The etching temperature is controlled under about 30° C.

The reaction is conducted for around 50 seconds to etch off about 2400 Å in depth.

EFFECTS OF THE INVENTION

The specimen as etched is inspected with an SEM. These results are displayed in the photograph in FIG. 1.

As shown in FIG. 1, the exposed $SiO_2$ film of the etched-off area was not attacked at all by the etchant. Besides, the fine edge definition of the CrSi pattern is clearly revealed. The undercut index (UI) of the etch profile is less than 1, as measured.

The recipe of this invention does not reduce the adhesion of the photoresist to the underlying materials. Furthermore, it does not react with the photoresist layer.

The etchant recipe of this invention may be applied whether in positive or in negative photoresist process. It is also able to depassivate the CrSi surface so that the etching may be induced to occur readily at a lower temperature.

The HF acid content of this invention is relative low (<1%), in comparison to about 9% in the conventional etchants. The invented etchant significantly lowers the degree of unnecessary etching of the underlying $SiO_2$ substrate, and considers good selectivity with respect to Si-based substrates: The characteristic of the greater process latitude makes this etchant adaptable to high volume production usage.

As the embodiments of the present invention described above, it is to be understood that the embodiments are merely illustrative principles of the invention and that any variations may be derived by those skilled in the art without departing from the scope of the invention. It is, therefore, intended that such variations are included within the scope of the appended claims.

I claim:

1. A method for the photo-etching of a CrSi film comprising 40 to 85% of Cr and 15 to 60% of Si, comprising:
    covering at least a portion of said CrSi film with a protection layer; and
    etching the exposed portion of said CrSi film with an etchant comprising 100 to 120 parts of 36.5 to 38% HCl, 1.0 to 2.0 parts of 48.8 to 49.2% HF, 0 to 10 parts of 30.0 to 32.0% $H_2O_2$ and 50 to 100 parts of 85 to 87% $H_3PO_4$.

2. A composition comprising 100 to 120 parts of 36.5 to 38% HCl, 1.0 to 2.0 parts of 48.8 to 49.2% HF, 0 to 10 parts of 30.0 to 32.0% $H_2O_2$ and 50 to 100 parts of 85 to 87% $H_3PO_4$.

3. The composition as claimed in claim 2 further comprising at least a wetting agent.

4. An etchant comprising an effective amount of a composition comprising 100 to 120 parts of 36.5 to 38% HCl, 1.0 to 2.0 parts of 48.8 to 49.2% HF, 0 to 10 parts of 30.0 to 32.0% $H_2O_2$ and 50 to 100 parts of 85 to 87% $H_3PO_4$.

5. The etchant as claimed in claim 4 further comprising at least a wetting agent.

6. A method for etching a metalized film comprising:
    the preparation of a metalized film on a substrate;
    the preparation of an etchant comprising 100 to 120 parts of 36.5 to 38% HCl, 1.0 to 2.0 parts of 48.8 to 49.2% HF, 0 to 10 parts of 30.0 to 32.0% $H_2O_2$ and 50 to 100 parts of 85 to 87% $H_3PO_4$;
    covering at least a portion of said metalized film with an etch-resistant layer; and
    etching the exposed portion of said metalized film with said etchant.

* * * * *